United States Patent
Joet

(10) Patent No.: US 10,807,858 B2
(45) Date of Patent: Oct. 20, 2020

(54) DEVICE FOR TRANSMITTING A MOVEMENT AND A FORCE BETWEEN TWO ZONES THAT ARE INSULATED FROM ONE ANOTHER

(71) Applicant: COMMISSARIAT A L'ENERGIE ATOMIQUE ET AUX ENERGIES ALTERNATIVES, Paris (FR)

(72) Inventor: Loic Joet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/466,432

(22) PCT Filed: Dec. 6, 2017

(86) PCT No.: PCT/FR2017/053409
§ 371 (c)(1),
(2) Date: Jun. 4, 2019

(87) PCT Pub. No.: WO2018/104656
PCT Pub. Date: Jun. 14, 2018

(65) Prior Publication Data
US 2019/0308873 A1 Oct. 10, 2019

(30) Foreign Application Priority Data

Dec. 7, 2016 (FR) ..................................... 16 62049

(51) Int. Cl.
*H04R 25/00* (2006.01)
*B81B 3/00* (2006.01)
(Continued)

(52) U.S. Cl.
CPC ........... *B81B 3/0021* (2013.01); *H04R 19/02* (2013.01); *H04R 19/04* (2013.01); *H04R 31/00* (2013.01);
(Continued)

(58) Field of Classification Search
CPC .... B81B 2201/0257; B81B 2201/0264; B81B 2203/0127; B81B 2203/04;
(Continued)

(56) References Cited

U.S. PATENT DOCUMENTS 9,157,821 B2 * 10/2015 Robert .................. G01L 9/0019
9,528,895 B2 * 12/2016 Robert .................. B81B 3/0021
(Continued)

FOREIGN PATENT DOCUMENTS

EP 2 921 836 A1 9/2015

OTHER PUBLICATIONS

International Search Report dated Feb. 22, 2018 in PCT/FR2017/053409 filed on Dec. 6, 2017.
(Continued)

*Primary Examiner* — Phylesha Dabney
(74) *Attorney, Agent, or Firm* — Oblon, McClelland, Maier & Neustadt, L.L.P.

(57) ABSTRACT

A device transmits a movement and a force between a first zone and a second zone which are insulated from one another in a sealed manner. The device includes a planar support, a transmission element that is rotatably movable with respect to the support by a pivot joint having an axis of rotation that is parallel to a plane of the support, an opening in the support through which the transmission element passes and level with which the pivot joint is positioned. The transmission element includes at least one first transmission arm on one side of the plane of the support and one second transmission arm on the other side of the plane of the (Continued)

support, and sealed insulation positioned in the opening, such that it insulates the first zone from the second zone in a sealed manner and allows the rotational movement of the transmission element.

22 Claims, 10 Drawing Sheets

(51) Int. Cl.
    *H04R 19/02*     (2006.01)
    *H04R 19/04*     (2006.01)
    *H04R 31/00*     (2006.01)

(52) U.S. Cl.
    CPC ......... *B81B 2201/0257* (2013.01); *B81B 2201/0264* (2013.01); *B81B 2201/037* (2013.01); *B81B 2203/0127* (2013.01); *B81B 2203/04* (2013.01); *B81B 2203/051* (2013.01); *B81B 2203/058* (2013.01); *H04R 2201/003* (2013.01)

(58) Field of Classification Search
    CPC ........ B81B 2203/051; B81B 2203/058; B81B 3/0021; H04R 19/02; H04R 19/04; H04R 2201/003; H04R 31/00
    USPC .......................................... 381/174
    See application file for complete search history.

(56) References Cited

U.S. PATENT DOCUMENTS

| | | | |
|---|---|---|---|
| 9,829,406 B2* | 11/2017 | Geisberger | G01L 9/0073 |
| 2013/0000411 A1* | 1/2013 | Robert | G01L 9/006 |
| | | | 73/708 |
| 2014/0060169 A1* | 3/2014 | McNeil | G01L 9/12 |
| | | | 73/146.5 |
| 2015/0251899 A1 | 9/2015 | Dehe et al. | |
| 2015/0268115 A1* | 9/2015 | Robert | G01L 9/006 |
| | | | 73/718 |

OTHER PUBLICATIONS

French Preliminary Search Report dated Sep. 27, 2017 in FR 1662049 filed on Dec. 7, 2016.
Dehe, A., "Silicon microphone development and application," Elsevier, ScienceDirect, Sensors and Actuators A 133, 2007, pp. 283-287.
U.S. Appl. No. 15/625,314, filed Jun. 16, 2017, US 2017/0363424 A1, Federico Maspero, et al.
U.S. Appl. No. 16/008,578, filed Jun. 14, 2018, US 2018/0362333 A1, Federico Maspero, et al.

* cited by examiner

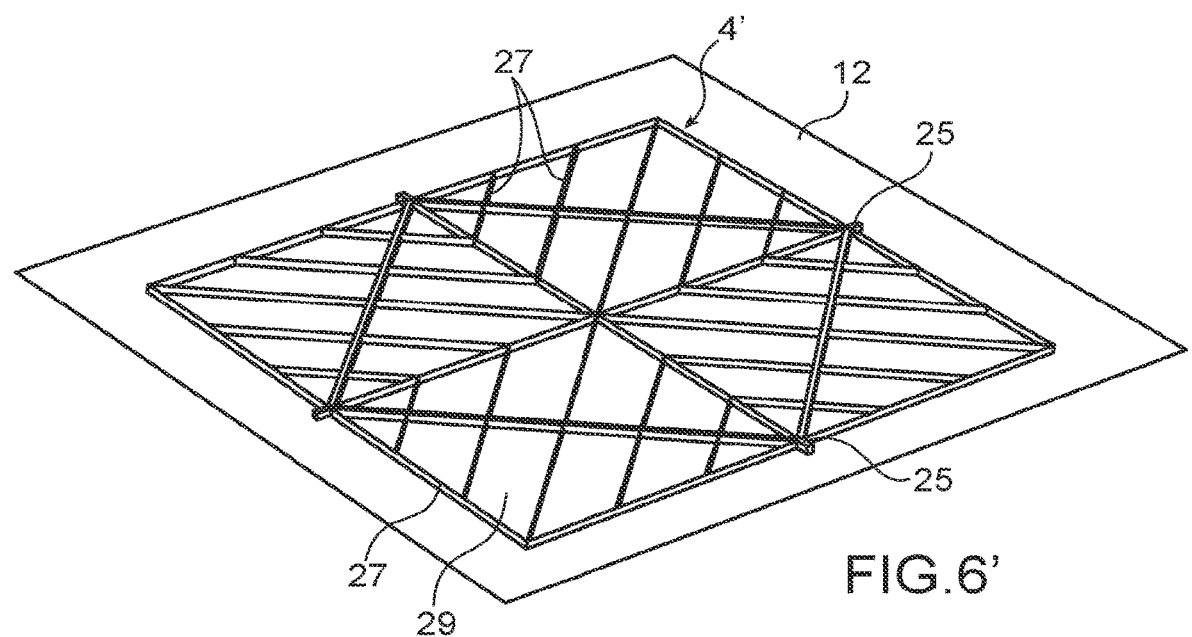
FIG.6'
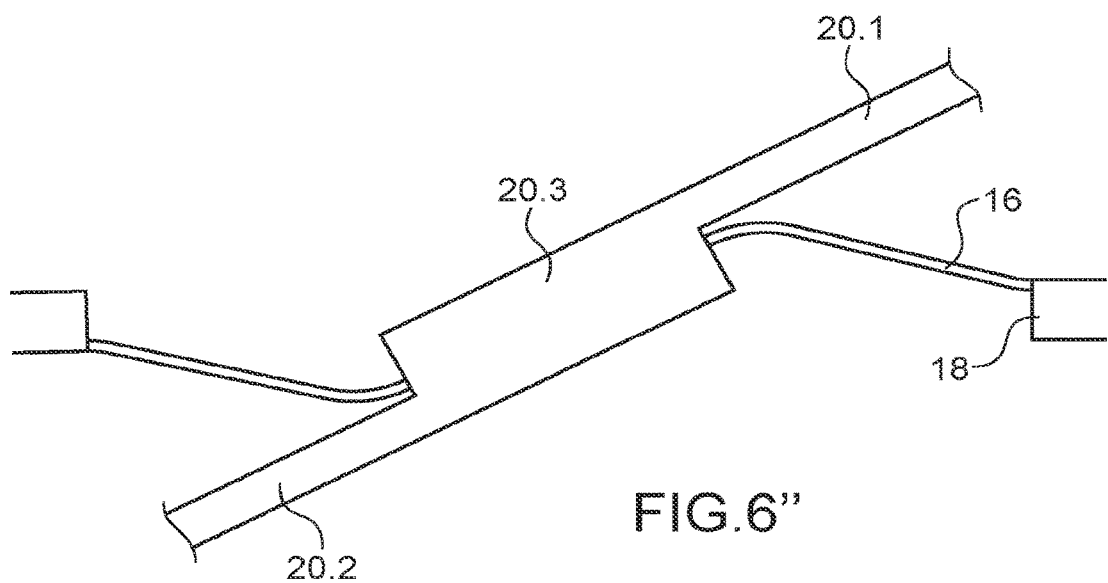
FIG.6"

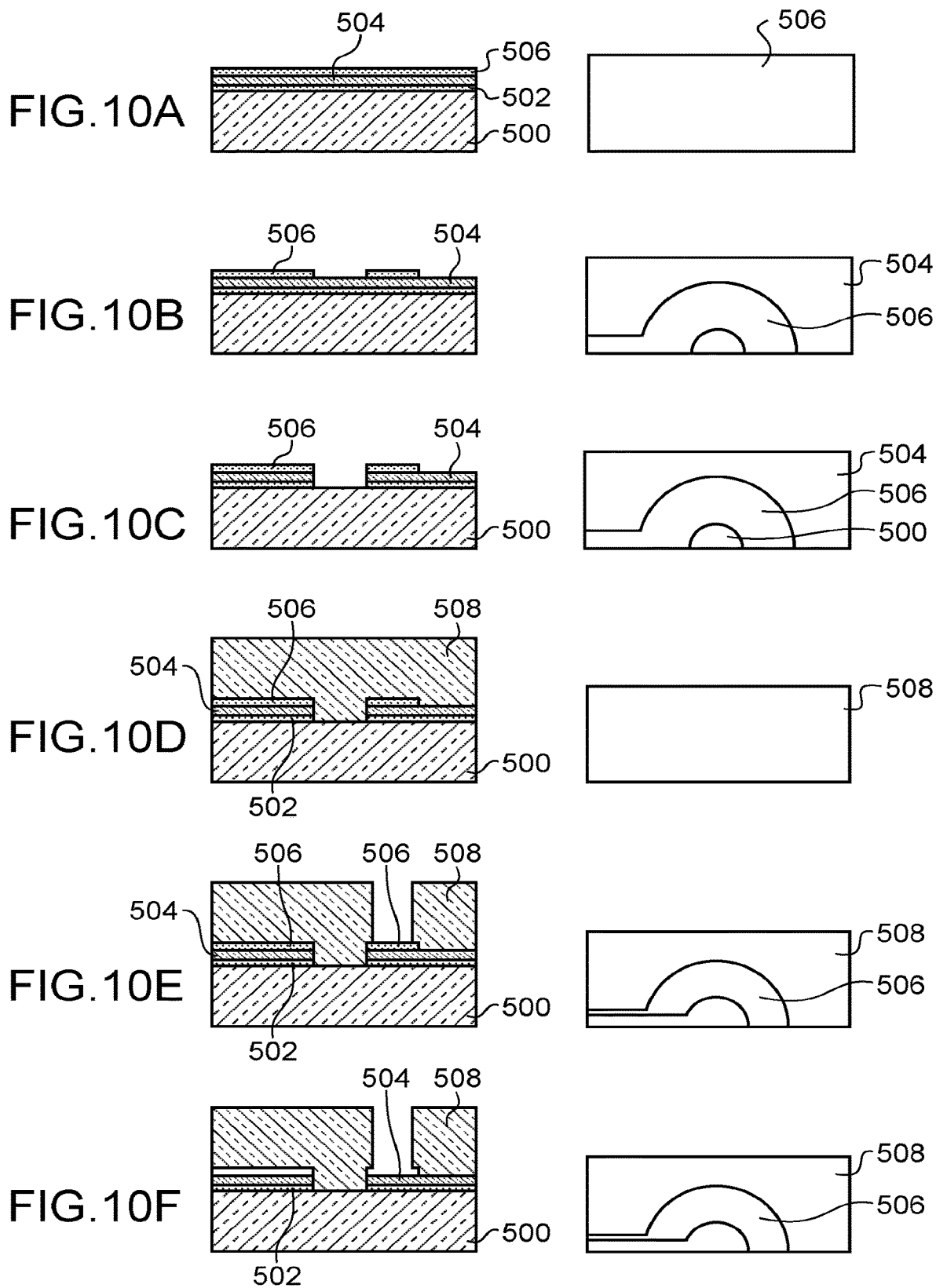

DEVICE FOR TRANSMITTING A MOVEMENT AND A FORCE BETWEEN TWO ZONES THAT ARE INSULATED FROM ONE ANOTHER

TECHNICAL FIELD AND STATE OF PRIOR ART

The present invention relates to a device for transmitting a movement and a force between two zones sealingly separated from each other in the field of microelectronics and in particular that of micro-devices of the microelectromechanical system (MEMS) and/or nanoelectromechanical system (NEMS) type. Such a device can for example be implemented in a device for measuring a pressure variation, for example to make a microphone or in a pressure sensor.

Microphones in microelectromechanics and/or in nanoelectromechanics represent a growing market, in particular by virtue of the market of mobile apparatuses, such as tablet computers, smartphone type portable telephones and other connected objects, in which they gradually replace electret microphones.

Microphones measure a pressure variation, therefore they comprise at least one part in contact with the external environment.

Most MEMS microphones currently produced are capacitive detection microphones, one embodiment of which is described in document A. Dehe: *Silicon microphone development and application*, (2007) *Sensors and Actuators, A: Physical*, 133 (2 SPEC. ISS.), pp. 283-287.

For example, they comprise a flexible membrane separating the external environment from a closed chamber, called a rear volume, acting as a pressure reference. The membrane is deformed under the effect of the pressure differential between both its faces. The membrane forms an electrode and a fixed and rigid counter-electrode is disposed facing the membrane. The membrane and the counter-electrode form a capacitance the value of which varies as a function of the membrane deformation under the effect of the pressure differential between both its surfaces.

Holes in the membrane, called vent holes, ensure pressure equalisation between the external environment and the rear volume of the microphone. Thus, the long term drifts of the atmospheric pressure, for example due to the altitude variation, an anticyclone or a depression, the amplitude of which is several orders of magnitude above that of sound, have no action on the membrane because they equalise on either side thereof. The holes are dimensioned such that this nullification is only applied to low frequencies, typically between 1 and 100 Hz, not to filter the audio frequencies.

The counter-electrode is also pierced with the holes and let air pass such that pressure can be set on the membrane surface.

This structure offers a number of advantages, however they have drawbacks in particular due to the presence of the counter-electrode. Indeed, the latter is in the acoustic path. Although it is with holes, it has an acoustic resistance, i.e. it offers a resistance to air flow, and thus to pressure setting. This resistance generates thermal noise, and thus a degradation in the detection threshold. It also generates dampening, which involves a reduction in the microphone band pass.

To limit this resistance, the area of the counter-electrode covered with holes can be increased, but that has the direct consequence of reducing in the facing areas, which proportionally reduces the capacitive detection. Thus, the transduction gain is reduced and the noise of the electronic part is less masked, causing once again a degradation in the detection threshold.

A compromise is thereby to be found to minimise the overall degradation in the detection threshold, in particular due to the acoustic resistance and to the noise of the electronics, while fulfilling the wanted band pass.

It can be contemplated to increase the area of the membrane and the counter-electrode to increase the facing area. But such an increase results in increasing the size of the chip and thus the cost thereof. Further, a higher-area membrane will move more air by being deformed. This volume of moved air creates an increase/decrease in the pressure in the rear cavity, thereby imposing a force opposite to the movement on the membrane. This force is proportional to the ratio of the membrane area square, on the rear volume. This force acts as a further spring onto the membrane, which will oppose to the movement. The increase in the membrane area will thus be accompanied with an increase in the size of the rear volume, and thus of the package if an equivalent membrane movement is desired to be maintained.

There are piezoelectric detection MEMS microphones in order to suppress the drawbacks resulting from the counter-electrode. For example, the membrane comprises a piezoelectric material. When deformed, charges are created at the surface of the piezoelectric material and are collected by electrodes encapsulating this material. The electric signal is representative of the number of charges created. In the case of the piezoelectric detection, the number of charges is given by the mechanical stresses within the material, it cannot be increased thanks to a bias voltage or any other external artefact. If more charges are desired to be obtained, the membrane size will have to be increased to collect more energy, in order to restrain more the piezoelectric material. On the other hand, in the case of a capacitive detection, the number of charges created is the product of the capacitance variation by the bias voltage. More charges can thus be collected by using higher bias voltages.

Further, like in capacitive detection, an increase in the membrane area imposes an increase in the rear volume in order to avoid an increase in the acoustic stiffness.

Consequently, a piezoelectric detection microphone offers a limited gain with respect to that of capacitive detection. Further, the associated electronics is more complex to design, because it has to process a lower signal. Thus, it consumes more current because it has to have a lower noise. The performance gain at the acoustic level is thereby at the cost of the electric field.

Document US 2015/0251899 A1 describes a sensor in which the counter-electrode is disposed inside the membrane in a controlled atmosphere which can be close to the vacuum. The relative movement of the membrane and of the counter-electrode does not cause air movement through the counter-electrode. Because of its placement under vacuum, the counter-electrode is fully masked from the acoustic world.

However, making such a structure is very complex, in particular the releasing the counter-electrode and sealing the volume in which the counter-electrode is to be insulated.

It further tends out to be difficult to make a sufficiently light structure to preserve a wide band pass, in spite of the structure of the deformable surface and the numerous pillars implemented inside the same.

Further, the pillars should both be many in number to enable the membrane to withstand vacuum, and leave enough area to place the counter-electrode.

Generally, it is desirable to be able to transmit a movement and a force between two zones sealingly insulated from each other, for example, when it is desired to have capacitive detection means in a controlled atmosphere or when one of the zones is an aggressive environment and the other zone has to be protected from this aggressive environment.

For example, the transmission of a force to a strongly reduced pressure atmosphere makes it possible:
to implement a vibratory beam detection with a high quality coefficient;
to implement a capacitive detection with a reduced viscous friction (and associated Newtonian noise);
to implement a capacitive motor whose viscous frictions opposite to the movements is strongly reduced, in particular upon making a sound or ultrasound transmitter.

DISCLOSURE OF THE INVENTION

Consequently, one purpose of the present invention is to offer a device for transmitting a movement and a force between two zones sealingly insulated from each other, both zones being at different pressures.

The purpose of the present invention is achieved by a device for transmitting a force and a movement between two zones sealingly insulated from each other, said device comprising a support extending in a plane, at least one of the zones being located on one side of the plane, a transmission element extending between the first zone and the second zone, a pivot hinge through which the transmission element is rotatably hinged with respect to the support and sealed insulation means between the transmission element and the support at the pivot hinge, such that a force and a movement applied to the transmission element in one of the first and second zones are transmitted in the other of the second and first zones while ensuring sealed insulation between both zones.

The sealed insulation means are able to be elastically deformed so as to little or not to impede rotation of the transmission element. The sealed insulation means advantageously comprise a membrane. This membrane can be provided very fine to offer a small resistance to the movement of the transmission element and reinforcements can be provided on the membrane to enable the same, for example, to withstand a pressure difference.

Since the transmission element has a rotational movement, its off-plane translational movements are substantially reduced, or even nullified. Advantageously, the rotational hinge is made by torsionally deformable arms which significantly limit, or even prevent the translational movement in an off-plane direction of the transmission element. The energy transmission in the movements apart from the rotational movement in the transmission is thereby reduced. By using deformable arms having a rectangular cross-section the off-plane dimension of which is strongly higher than the in-plane dimension, a rotational hinge having a low angular stiffness can be obtained, and thus very small energy losses can be achieved during the rotational movement. Further, the in-plane movements are limited, or even nullified, by the sealed insulation means. The mechanical efficiency of the transmission device is thus high.

Advantageously, one of the zones can be a controlled atmosphere chamber, advantageously a vacuum chamber, in which capacitive measurement means of the movement transmitted to the transmission element, and/or capacitive motors creating a force to be transmitted by the transmission element are provided. These capacitive means can thereby have a large electrode area without the viscous friction opposing to the movement of a part of said capacitive means.

Further, because of the nullification of the off-plane movements, in the case of a microphone, the effect of the atmospheric pressure on the measurement of the capacitive means is thereby substantially reduced, or even nullified. Therefore, the device measures only or nearly only the variation in acoustic pressure.

Further, the device can be designed to offer an amplification. Indeed, by moving the capacitive means away from the rotational hinge, i.e. by making a longer transmission arm, with a given rotation of the transmission element, the movement of the capacitive means is larger. In the case of measurement means, the signal collected is larger. In the case of the motor, the torque transmitted is larger.

The device can be implemented in a microphone, a static or dynamic differential pressure sensor.

In the case of a microphone, the first longitudinal end of the transmission element is for example secured to a membrane having a large area subjected to pressure variation, which transmits to the transmission element high frequency pressure variations, corresponding to the acoustic signal. Means for measuring the movement of the transmission arm are located at the second end of the transmission arm, for example capacitive detection means or a vibratory beam.

In the case of a loudspeaker, an actuator, for example of the capacitive type, can be provided at one end of the transmission element and applied to the membrane secured to the other end of the transmission element.

Therefore, one subject-matter of the present invention is a device, for a microelectromechanical system, for transmitting a movement and a force between a first zone and a second zone sealingly insulated from each other, said device comprising a support extending in a plane, a transmission element rotatably movable with respect to the support by means of a pivot hinge with an axis of rotation parallel to the support plane, an aperture in the support through which the transmission element passes and at which the pivot hinge is disposed, the transmission element comprising at least one first transmission arm on one side of the support plane in one of the first and second zones and a second transmission arm on the other side of the support plane in the other of said first and second zones, and sealed insulation means disposed in the aperture, such that they sealingly insulate the first zone from the second zone and they allow the rotational movement of the transmission element.

Preferably, the sealed insulation means comprise an elastically deformable membrane which is tensioned between a rim of the aperture and the transmission element. The sealed insulation means can comprise mechanical reinforcements on at least one of the faces of the membrane.

The pivot hinge advantageously comprises one blade or several aligned blades extending between the transmission element and an edge of the aperture and able to be torsionally deformed. The blade(s) advantageously (has) have a dimension along a direction orthogonal to the support plane such that it/they offer(s) a rigidity in the off-plane direction limiting off-plane movements of the transmission element.

In one exemplary embodiment, the transmission element comprises at least one transmission shaft connecting the first and second transmission arms, said transmission shaft extending in a direction orthogonal to the support plane on either side of the sealed insulation means. The blade(s) can be connected to the transmission shaft, and the assembly formed by the transmission shaft and the first and second transmission arms can be a rigid assembly.

In another exemplary embodiment, the transmission element comprises several transmission shafts able to be translationally moved along a direction orthogonal to the support plane. Each of the first and second transmission arms is for example hinged to each transmission shaft by a hinge allowing a rotation and a translation. The blade(s) is (are) for example mechanically connected to one of the first and second transmission arms. For each transmission shaft, the hinge allowing a rotation and a translation of said shaft can comprise one or more coupling blades.

The at least one of the first and second zones can form a controlled atmosphere chamber.

The transmission device can comprise an element movable relative to the support such as a piston or a membrane able to apply a movement and a force to the transmission element in the first zone.

Advantageously, the transmission device comprises, in the second zone, means for measuring the movement of and/or the force applied to the transmission element in the first zone and/or actuation means. For example, the transmission device comprises, in the second zone, an electrode secured to the transmission element and at least one counter-electrode forming means for measuring the movement of and/or the force applied to the transmission element in the first zone and/or actuation means.

Another subject-matter of the present invention is a system comprising at least one device according to the invention forming a differential pressure sensor.

The system can form a microphone, wherein the piston or the membrane comprises a face subjected to an environment the pressure variations of which are desired to be detected and a face subjected to a reference pressure.

The system can form a loudspeaker, wherein the piston or the membrane is to be moved to emit a sound.

Another subject-matter of the present invention is a method for manufacturing a transmission device according to the invention comprising, from a stack comprising a substrate, a first sacrificial layer, a sandwich layer for forming the sealed insulation means, a second sacrificial layer:

a) structuring the layers so as to have access to the substrate,
b) forming a thick layer on the second sacrificial layer and in contact with the substrate,
c) forming one of the transmission arms,
d) at least partially removing the second sacrificial layer,
e) bonding a cap on the thick layer,
f) turning over the assembly,
g) forming the other transmission arm,
h) at least partially removing the first sacrificial layer so as to release the layer.

In the case where the transmission element comprises at least one transmission shaft, the latter can be formed at least partly during step c) and at least partly during step g).

For example, step c) is achieved by structuring the thick layer and step g) is achieved by structuring the substrate.

BRIEF DESCRIPTION OF THE DRAWINGS

The present invention will be better understood based on the description that follows and the appended drawings in which:

FIGS. 10A to 10J are partial side and top views of elements obtained during the different steps of an exemplary method for making a device according to the invention.

DETAILED DISCLOSURE OF PARTICULAR EMBODIMENTS

Figure 1:
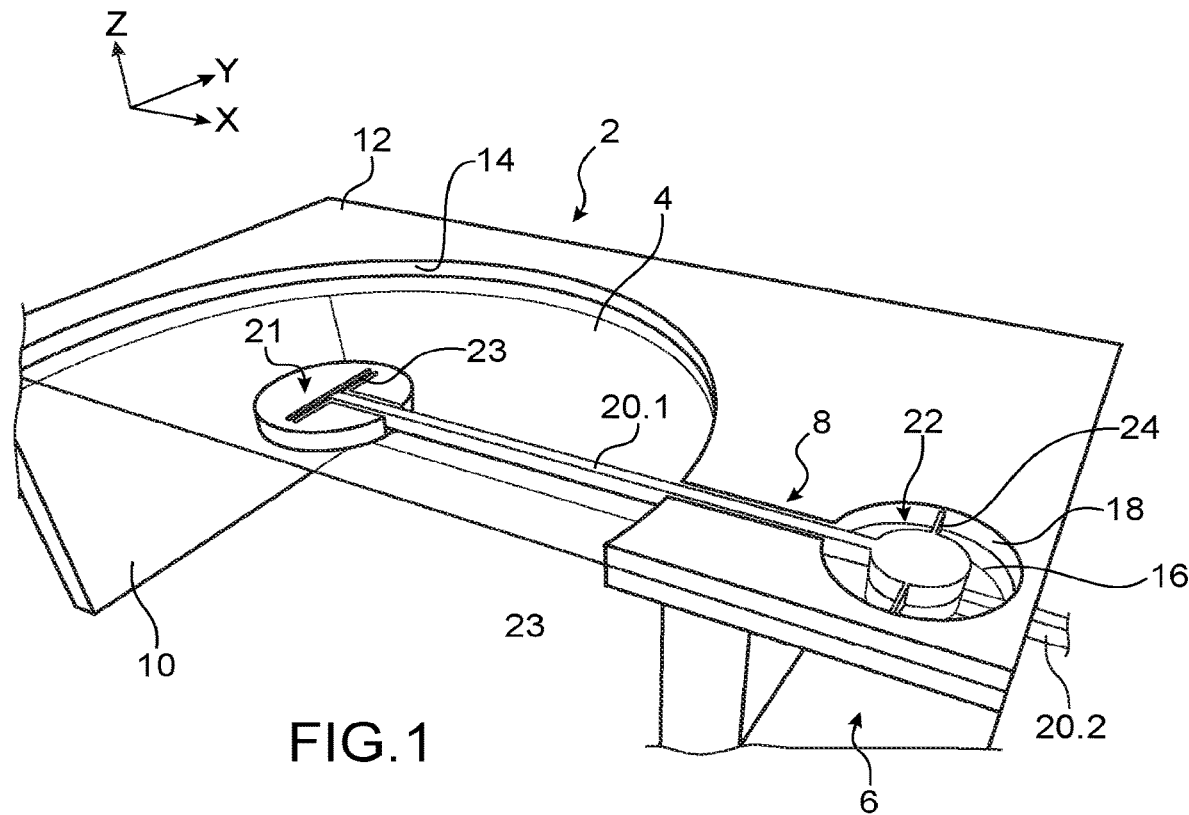
FIG. 1 is a top perspective view of an exemplary embodiment of a device according to the invention on the detection side able to detect the pressure difference, that can be implemented in a differential pressure sensor, and that can be used to form a microphone.

In the present application, a microelectronic system comprises one or more devices of the microelectromechanical system type and/or one or more devices of the nanoelectromechanical system type.

In the description that follows, the device will be described in an application to microphones, but this application is not restrictive and other exemplary applications will be given in the following.

The terms "upper" and "lower" and "on" and "below" are used to describe locations within the context of the representations of the drawings and are in no way limiting.

In FIGS. 1 to 6, an exemplary embodiment of a device according to the invention that can form a microphone can be seen.

The measurement chamber 6 is defined by the plate, the support and a sealed insulation element 16 such that the internal environment of the measurement chamber is insulated.

The device comprises a package 2, a measurement membrane 4 in contact with the external environment a variation in acoustic pressure of which is desired to be measured, a measurement chamber 6 insulated from the external environment and mechanical transmission means 8 between the external environment and the measurement chamber 6.

The package 2 comprises for example a support 10 and a plate 12 extending in a plane P and disposed on the support 10.

The plate 12 comprises a first aperture 14 closed by the membrane 4. In the example represented, the first aperture 14 is of a circular shape but this shape is in no way limiting.

It could be of a square, rectangular shape or another shape. The membrane 4, the plate 12, the support 10 and a bottom 13 delimit two volumes.

The membrane can be subjected to a pressure difference between both volumes. Thereby, the device forms a static differential pressure sensor.

A dynamic differential pressure sensor can for example be made by making a hole in the membrane, such that at a low frequency, pressures in both volumes balance and in case of a high frequency variation, pressures in both volumes have no time to balance, allowing the detection of this high frequency pressure variation.

If one of the volumes is closed, a microphone can be made. For example, the closed volume can be made with a cap bonded to the plate 12 and defining a large reference volume.

The plate 12 comprises a second aperture 18 opening into the measurement chamber. The second aperture 18 is partly closed by the sealed insulation element 16. The insulation element 16 is further elastically deformable so as not to oppose to the rotation of the transmission means, but to limit their in-plane movement as will be described in the following.

In the case of a microphone and of a vacuum measurement chamber, the sealed insulation element is configured to withstand a pressure difference of about $10^5$ Pa.

The transmission means comprise a transmission element extending at rest along an axis X and rotatably hinged by a pivot hinge 22 to the package 2. In this example, the transmission element is rigid or not much deformable.

The transmission element 20 comprises a first transmission arm 20.1 disposed in the external environment and a second transmission arm 20.2 disposed in the measurement chamber. In this example, both transmission arms 20.1, 20.2 are aligned with each other.

In the example represented, the first transmission arm 20.1 and the second transmission arm 20.2 are rigidly connected through a central portion 20.3, called a transmission shaft. In the example represented, the transmission shaft 20.3 is of a circular cross-section cylindrical shape whose dimension along the axis Z is substantially equal to that of the plate.

Also in the example represented, the first transmission arm 20.1 and the second transmission arm 20.2 are disposed in two distinct planes, the first transmission arm 20.1 being located above the sealed insulation element 16 and the second transmission arm being located below the sealed insulation element 16.

The transmission arm 20.3 passes through the sealed insulation element 16.

In the example represented, the first transmission arm 20.1 is connected to a first zone of the side face of the transmission shaft 20.3 and the second transmission arm 20.2 is connected to the transmission shaft in a second zone of its side face, diametrically opposite to the first zone.

The free end of the first transmission arm 20.1 is connected to the membrane 4 through a hinge 21 transmitting the movement along the direction Z while allowing rotation about the axis Y and translation along axis X. In the example represented, two blades 23 parallel to axis Y are torsionally deformable.

It could be contemplated to implement several transmission arms each connected through a link to a same membrane, each transmission arm would then be hinged to the plate 12. Each transmission arm could enable the membrane movement to be detected. By recovering strains at several places of the membrane, making the membrane can be facilitated. Conversely, the device could comprise several membranes connected to a single transmission arm.

In the example represented, the membrane 4 is deformable and is suspended to the edge of the first aperture 14. It is deformed under the effect of the pressure variation. The reference volume can be connected externally through a small hole which could be located in the membrane or in another wall of the reference volume.

In another exemplary embodiment, the membrane could be replaced by a rigid piston 4'. The piston would be for example cut out and/or rigidified by one or more reinforcements. For example, the piston could advantageously comprise a rigidification structure of a fine layer collecting the pressure difference throughout the surface. An example is for example shown in FIG. 6'.

The piston is connected to the plate 12 by connecting elements 25, which enable the piston to be moved in an off-plane direction. The connection elements comprise for example a beam connected to the plate and to the piston by deformable blades. In the example represented, four connection elements 25 disposed in the centre of each piston edge are implemented. The transmission element is not represented. In this representation, the piston comprises a rigidification structure 27 for example made in the layer used for making the first or second transmission arm, and a fine membrane 29. Stops can be provided, disposed so as to limit the off-plane piston movement in case of an excessive pressure difference.

The piston has a high rigidity, which limits the deformation energy losses, while advantageously limiting the mass. Indeed, an increase in the mass causes a loss in the band pass.

In the case of a cut-out piston, the rigidification structure advantageously comprises a rim extending in the direction Z on its external perimeter so as to lengthen the air path of the piston and reduce leaks between the external environment and the closed volume acting as a reference.

By virtue of the structure implemented, pressure is collected throughout the surface and the energy lost in the piston deformation is negligible.

Further, it enables the device mass to be reduced.

As has been described for a device implementing a membrane, it could be contemplated to implement connection elements connecting the piston to the plate, the connection elements being hinged to the plate and/or to the piston, in order to improve the piston translational movement along the axis Z.

Further, the piston can take any shape enabling the microelectromechanical and/or nanoelectromechanical systems to be optimised.

Figure 2:
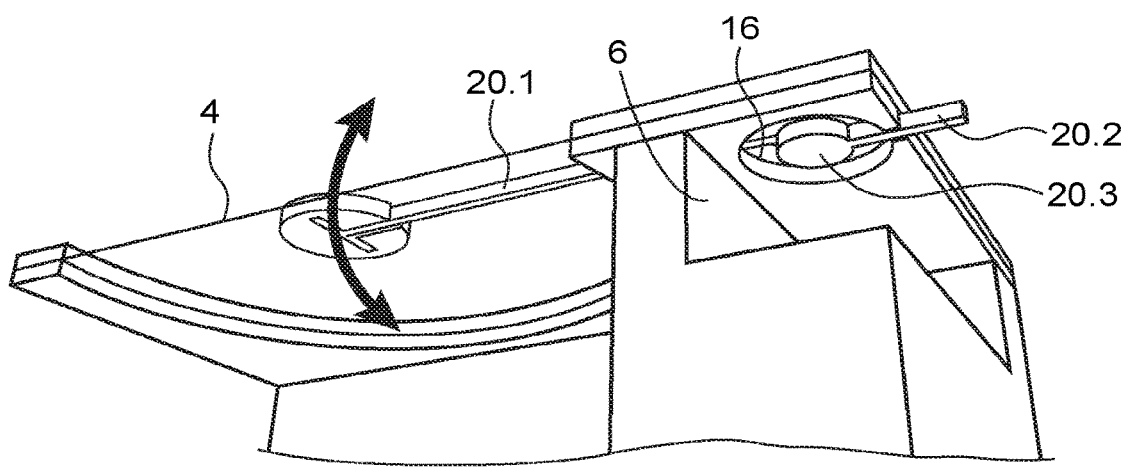
FIG. 2 is a bottom partial perspective view of the device of FIG. 1.
Figure 5:
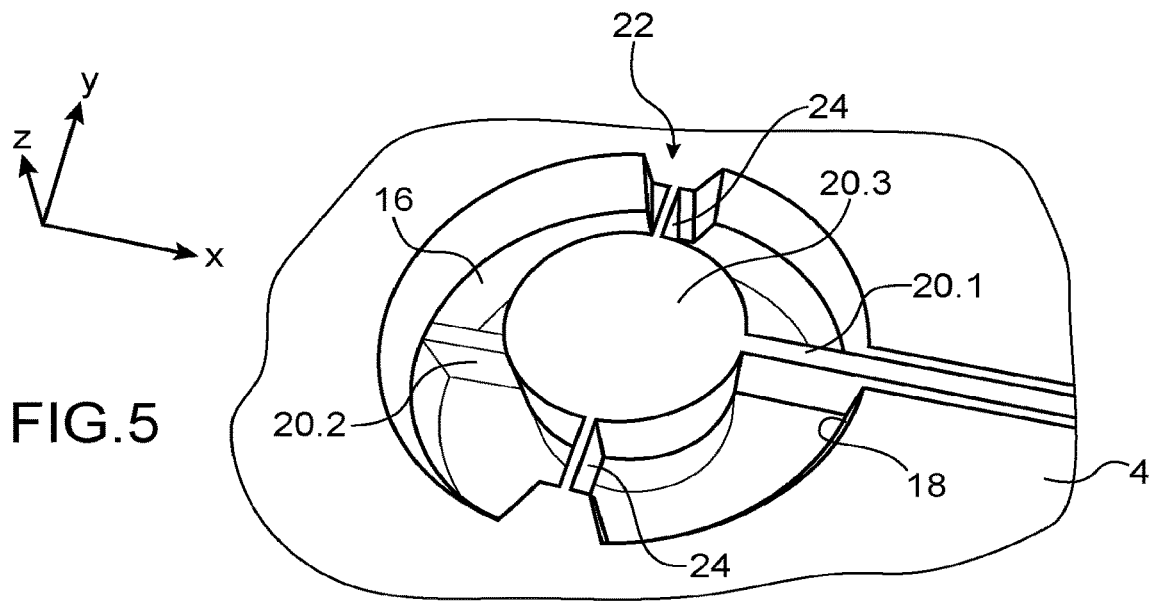
FIG. 5 is a detail view of the device of FIG. 1.
Figure 6:
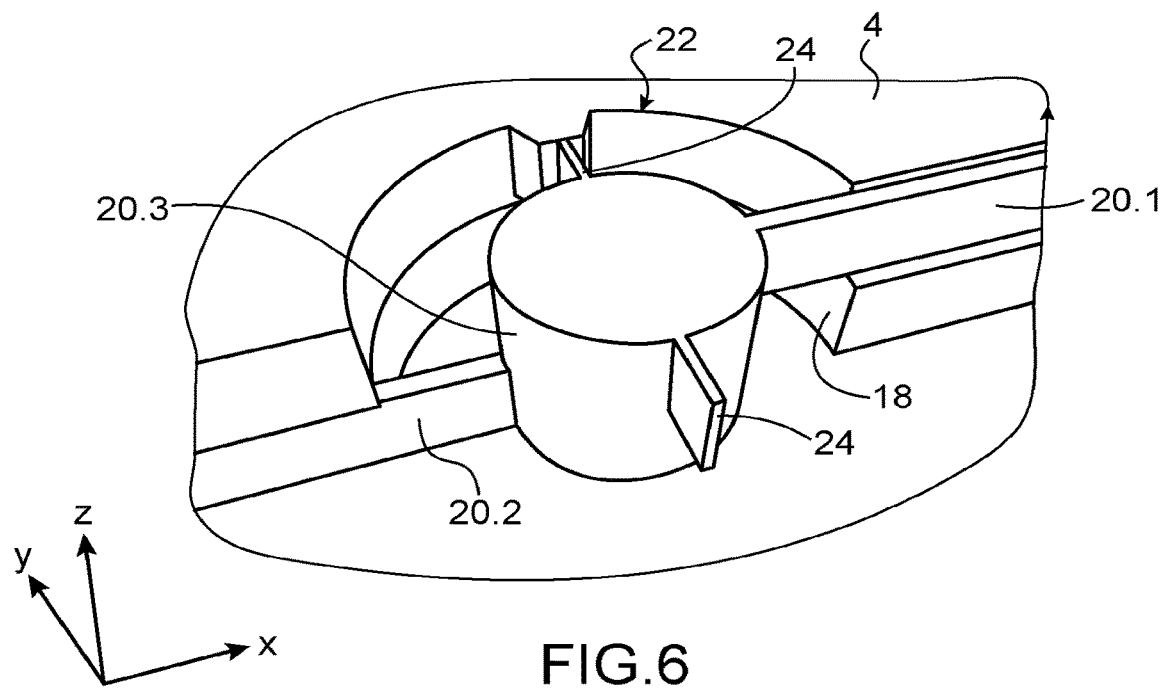
FIG. 6 is a cross-section view similar to that of FIG. 5, the sealed insulation element having been removed, FIG. 6' is a schematic representation of an exemplary piston provided with rigidification means, FIG. 6" is a schematic cross-section view of the pivot hinge of FIGS. 5 and 6 subjected to a deformation.

In FIGS. 5 and 6, detail views of the pivot hinge 22 of FIGS. 1 and 2 can be seen. In the example represented, it comprises two remote blades 24 extending perpendicular to the plate plane and each extending from one edge of the central portion. In this example, the blades are in contact with the sealed insulation element 16, but that is not limiting.

The blades have a dimension in direction X so as to be torsionally deformed about the axis Y and define with the sealing membrane 16, the axis of rotation of the pivot hinge. In the example represented, the axis of rotation is located at about the intersection of the plane of the sealing membrane 16 and the plane of the blades 24. The axis of rotation is centered on the sealing membrane such that the action of the pressure difference between both faces is the same on each side of the axis of rotation.

Further, the blades 24 have a significant dimension along direction Z, thus offering a large rigidity in the off-plane direction Z, which advantageously limits the off-plane movement of the transmission element. Thus, the pressure difference between the external environment and the measurement chamber does not tend to move the transmission element and does not influence the measurement.

In the example represented, the blades extend between the sealed insulation element 16 and the upper face of the plate.

Further, the sealed insulation element 16 limits movements in the plane XY.

The sealed insulation element 16 is such that it is deformed under the effect of the movement of the rotating transmission arms, the stiffness of the insulation element is compatible with the detection means. In the case of a capacitive detection, the deformation of the connection comprising the torsionally biased beams 24 and the membrane preferably brings about the rigidity required to achieve the proper resonance frequency. In the case of the transmission of a strain, the stiffness generated by the deformation of the connection comprising the torsionally biased beams 24 and the membrane is preferentially lower, or even much lower than that generated by the strain to be transmitted, for example the compression of a vibratory gauge for example.

In FIG. 6", a schematic representation of the device at the pivot hinge can be seen in a state where the transmission arms are subjected to a pressure variation and are tilted with respect to the plate under the effect of this pressure difference. The sealed insulation element 16 is deformed.

The sealed insulation element 16 and the torsion blades are readily deformed to enable the transmission arms to be rotated and oppose to the movements in directions X, Y and Z at this axis of rotation. The proportion of lost energy during the useful movement transmission is limited, the hinge has thereby a very good mechanical efficiency.

Further, as indicated below, the effect of a pressure differential between the external environment and the measurement chamber is suppressed.

Figure 3:
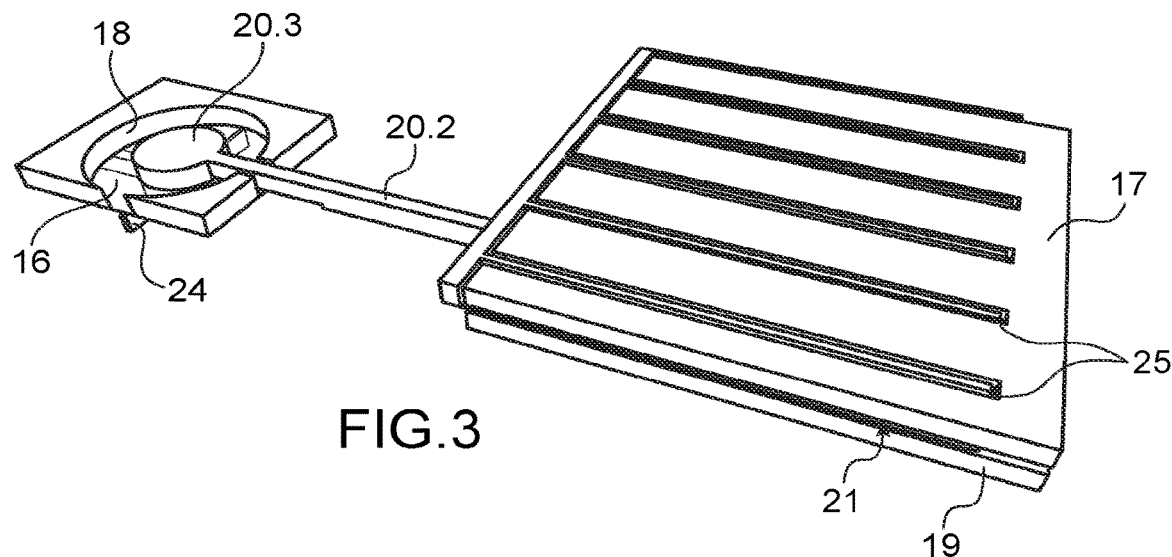
FIG. 3 is a perspective view of an exemplary embodiment of a device according to the invention on the side of the pressure difference measurement.
Figure 4:
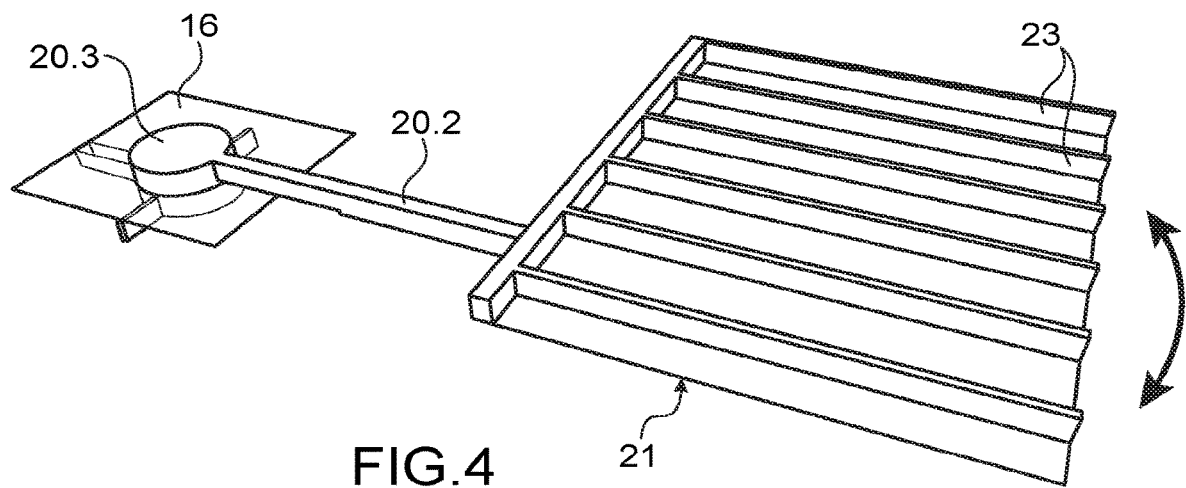
FIG. 4 is a view identical to that of FIG. 3, part of the capacitive measurement means having been removed.

In FIGS. 3 and 4, an example of air gap variation capacitive measurement means the rotational movement of the transmission arms can be seen.

In the example represented and advantageously, the capacitive measurement means comprise a first fixed electrode 17, a second fixed electrode 19 remote from the first fixed electrode 17 and a movable electrode 21 attached to the free end of the second transmission arm 20.2 and moved with the transmission arm. The movable electrode 21 is disposed between the first fixed electrode 17 and the second fixed electrode 19 in parallel to the same and able to be moved to either fixed electrodes 17, 19. Such measurement means allow a differential measurement. The electrode 19 is formed in the plate 12.

Measurement means with a fixed electrode and a movable electrode do not depart from the scope of the present invention.

The first fixed electrode 17 is secured to the plate in the measurement chamber.

In the example represented, the movable electrode 21 comprises, on its upper face, linear reinforcements 23 parallel to direction X, the first electrode is shaped to house these reinforcements 23. They comprise recesses 25 housing the reinforcements 23.

The movable electrode has a proper rigidity because of the electrostatic forces and a reduced mass, in order to achieve high resonance frequencies.

By measuring the air gap variation between the movable electrode 21 and the first 17 and second 19 fixed electrodes, the movement of the transmission element can be detected and thus the pressure variation can be determined.

Planar, fixed and movable electrodes without a reinforcement do not depart from the scope of the present invention.

Alternatively, the capacitive measurement means could be with an area variation using interdigitated combs. For example in the example represented, the reinforcements would form the electrodes carried by a movable support and the first fixed electrodes would be formed in the support 17. The capacitance variation would be measured between the side surfaces of the electrodes and the side surfaces of the first fixed electrodes.

The atmosphere in the measurement chamber is advantageously vacuum in order to reduce viscous friction phenomena and thermal noises associated therewith.

As has been described for piston 4, the movable electrode could be connected to several transmission elements having different axes of rotation, through a mechanical connection allowing an off-plane rotation between the arm and the movable electrode. Thus, the movable electrode would have a translational movement along axis Z, with the proviso that all the transmission elements transmit the same movement.

Figure 7A:
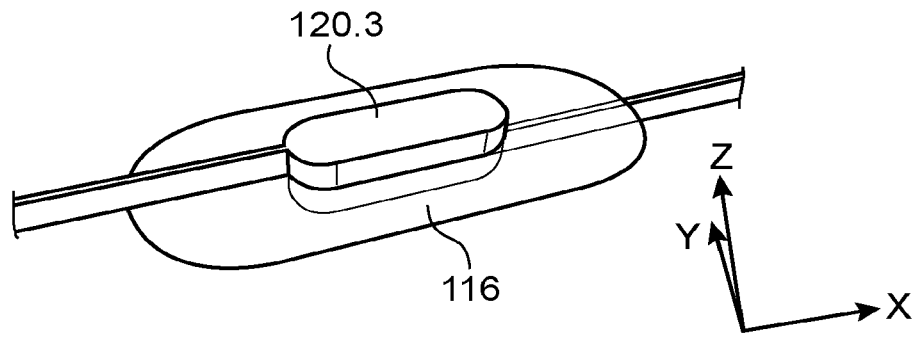
FIGS. 7A to 7C are perspective views of other exemplary embodiments of the pivot hinge that can be implemented in the device according to the invention.
Figure 7B:
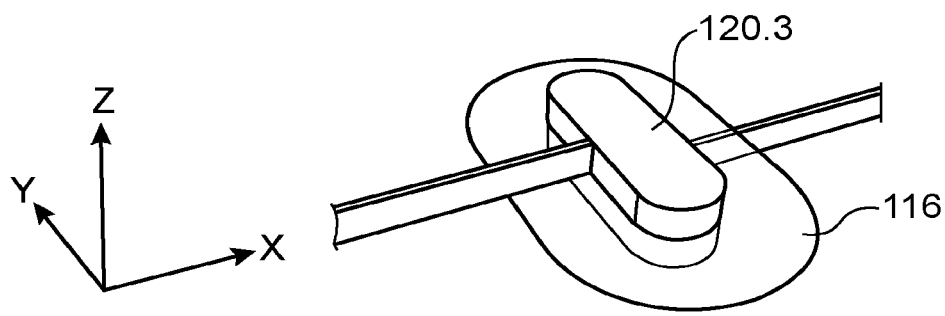
Figure 7C:
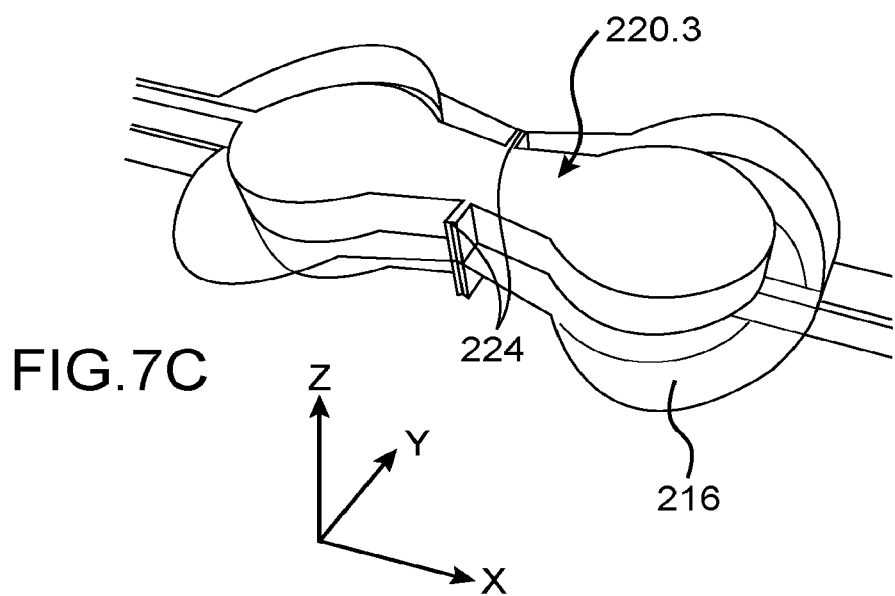

In FIGS. 7A to 7C, alternative embodiments of the transmission shaft and its assembly into the plate can be seen.

In FIG. 7A, the transmission shaft 120.3 has an elongate shape the largest length of which is aligned with axis X. In the example represented, the transmission shaft has an oblong cross-section in the device plane. The sealed insulation element 116 has also an elongate shape along axis X. The transmission element thereby has an increased rigidity, the energy lost in deforming the transmission element is reduced. Thereby, there is less loss in the movement transmission from one arm to the other.

The torsion blades that ensure the pivot connection are not represented.

The ends of the sealed insulation element 116 along axis X undergo a larger off-plane deformation. The sealed insulation element 116 thereby has a larger stiffness and is able to accommodate stronger stresses.

In FIG. 7B, the transmission shaft 120.3 has an elongate shape in direction Y, an oblong shape in the example represented. The sealed insulation element 116 thereby has also an elongate shape along axis Y.

Preferably, the transmission shaft has a shape free of angular shape to reduce stresses in the sealed insulation element. Thereby, it has preferably a shape delimited by rounded perimeters. However, a transmission shaft whose cross-section in the device plane has a polygonal shape is contemplatable in particular if the angles are rounded.

In FIG. 7C, an example of a transmission shaft having an elongate shape along axis X and reducing stresses in the membrane can be seen.

The transmission shaft 220.3 has in its central zone along axis X a thinned zone in direction Y, the torsion blades 224 connecting the transmission shaft to the plate 212 at the thinned zone. The aperture, as well as the sealed insulation element 216 have a homothetic shape to that of the transmission shaft.

Figure 8A:
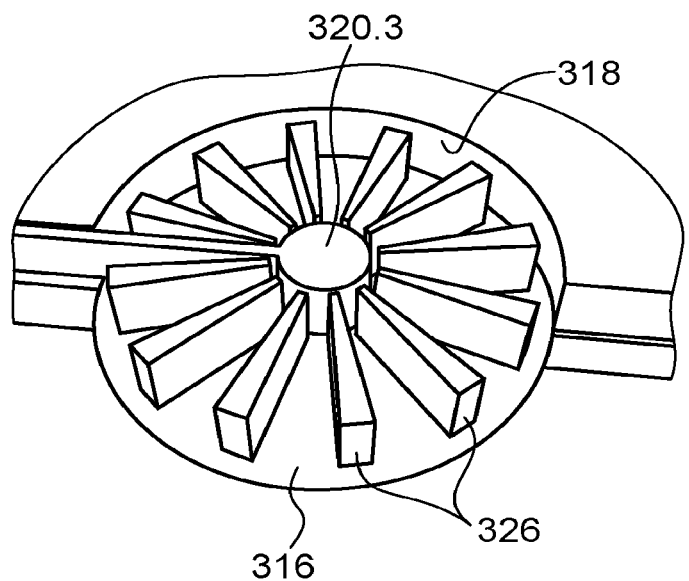
FIGS. 8A and 8B are top and bottom perspective views of another exemplary embodiment of the pivot hinge and of the sealed insulation element.
Figure 8B:
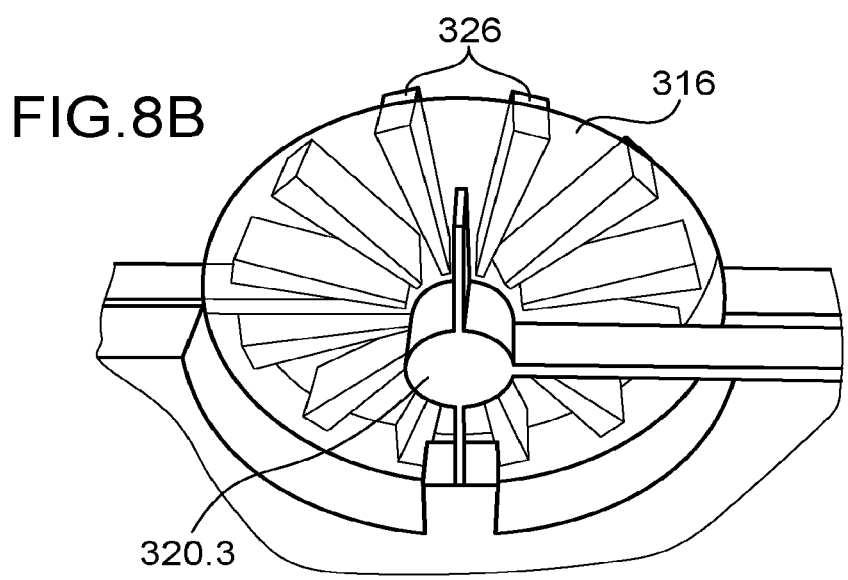
Figure 8C:
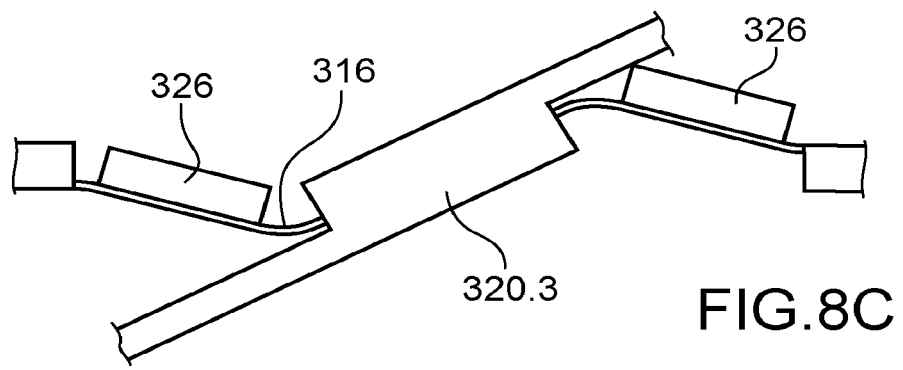
FIG. 8C is a schematic cross-section view of the pivot hinge of FIGS. 8A and 8B subjected to a deformation.

In FIGS. 8A to 8C, another exemplary embodiment of the device according to the invention in which the sealed insulation element has a reduced flexural stiffness in order to reduce the angular stiffness of the hinge can be seen.

To that end, the area of the sealed insulation element 316 can for example be increased in order to increase the distance between the periphery of the transmission shaft and the perimeter of the port. Alternatively or in combination, the thickness of the sealed insulation element can also be reduced. Advantageously, in order to limit stresses due to the pressure difference between the external environment and the measurement chamber, reinforcements 326 are provided on one of the faces at least of the sealed insulation element 316. For example, the reinforcements 326 are radial and do not impede the deformation of the sealed insulation element 316. The sealed insulation element 316 can be deformed at the external periphery connected to the edge of the port 318 and at its internal periphery connected to the edge of the transmission shaft 320.3. The transmission element, in the deformed state, is represented in FIG. 8C.

Alternatively, the reinforcements could be concentric to the transmission shaft. Further, the reinforcements could be provided on either of the faces of the sealed insulation element.

Figure 9A:
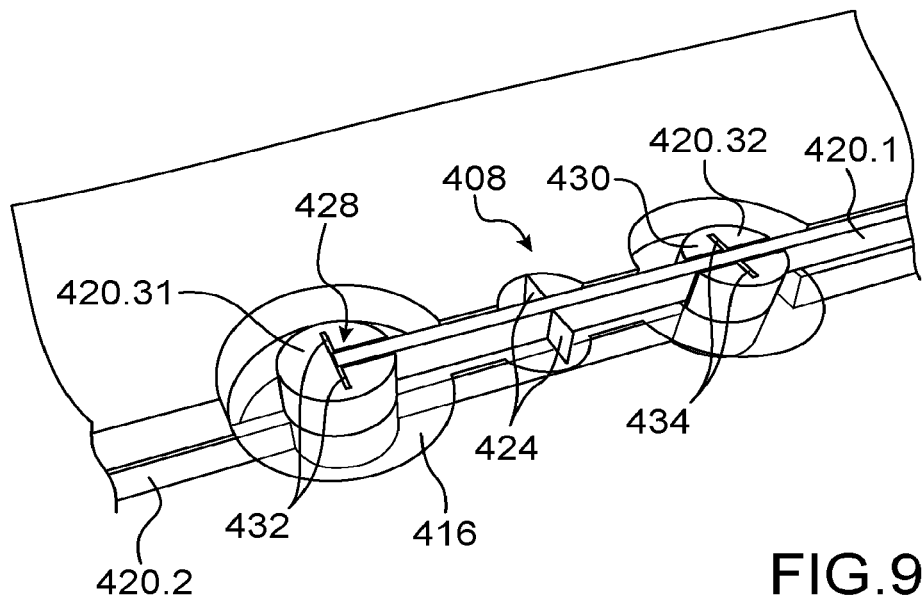
FIGS. 9A and 9B are top and bottom perspective views of another exemplary embodiment of the pivot hinge and of the sealed insulation element.
Figure 9B:
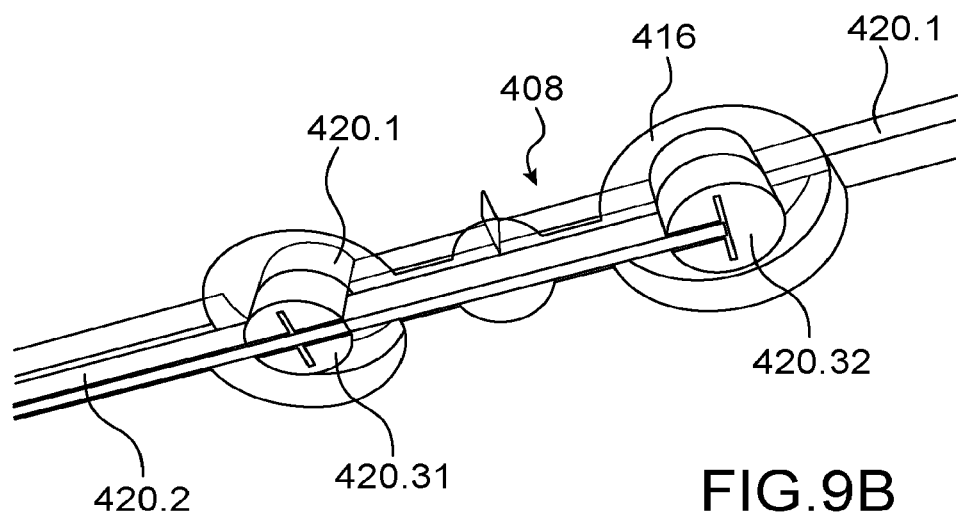

In FIGS. 9A and 9B, another exemplary embodiment of the device according to the invention comprising two translationally movable transmission shafts can be seen.

The device comprises a transmission element 408 comprising two transmission arms 420.1, 420.2 connected by two transmission shafts 420.31 and 420.32.

The transmission arms are connected to the transmission shafts such that the transmission shafts can be translationally moved in the direction of axis Z. This arrangement has the advantage of reducing the stresses undergone by the sealed insulation element 416.

The transmission shaft 420.31 is connected to a free end of the transmission arm 420.1 by a first hinge 428 and the transmission shaft 420.32 is connected to the transmission arm 420.1 in an intermediate zone thereof by a second hinge 430.

In the example represented, the first and second hinges 428, 430 comprise two blades 432, 434 contained in the device plane and able to be torsionally and flexurally deformed in the plane by flexure, thus the transmission shafts can have a translational movement along axis Z, and the transmission arms can have a rotational movement about an axis parallel to axis Y.

The second transmission arm 420.2 is connected to the transmission shafts 420.31, 420.32, as the first transmission arm 420.1.

As can be seen in FIG. 9B, the transmission shaft 420.32 is connected to the second transmission arm in an intermediate zone thereof and the transmission shaft 420.31 is connected to the free end of the second transmission arm.

Further, the first transmission arm is connected to the plate by two torsionally deformable blades 424 and defining the axis of rotation. In the example represented and advantageously, the blades 424 are located in the middle between both transmission shafts such that the external pressure does not generate a rotation which would be added to the signal to be measured.

The blades 424 are opposed to the strains due to pressure difference from one side of the plate to the other, and thus dramatically reduce their effects to make them negligible.

The "deformable" transmission element thus formed enables the movement to be transmitted from one side of the plate to the other.

During a movement transmission from one side to the other, one of the transmission shafts is moved in one sense in direction Z and the other transmission shaft is moved in an opposite sense in direction Z. The overall translation is thus nullified.

Radial reinforcements and/or concentric reinforcements are contemplatable.

Figure 11:
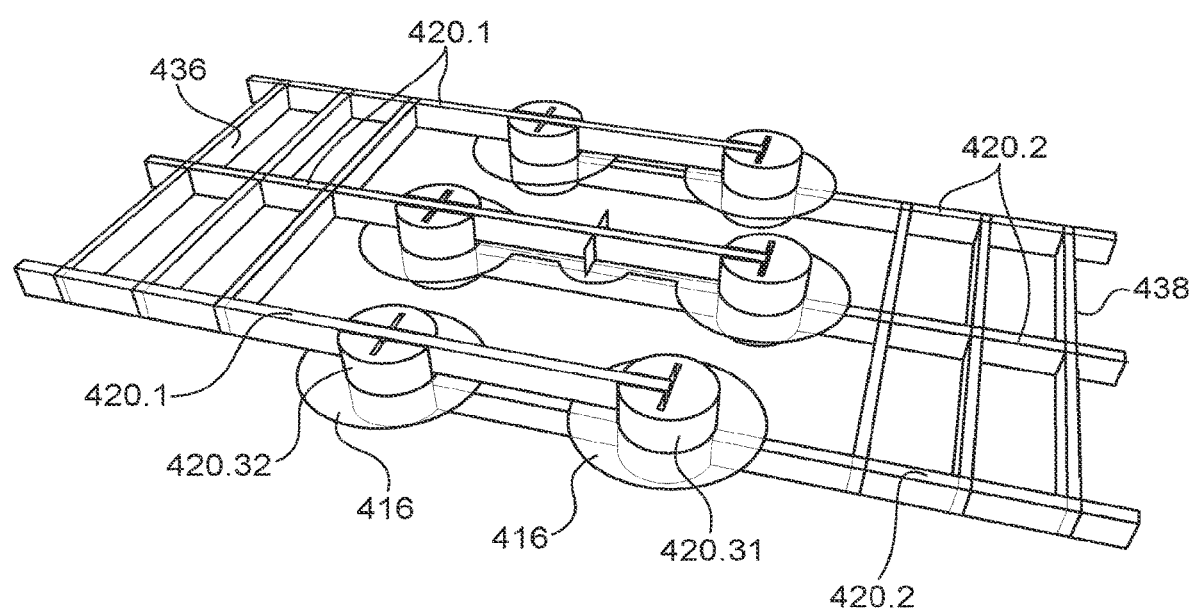
FIG. 11 is a perspective view of an alternative of the example of FIGS. 9A and 9B.

It will be understood that the device of FIGS. 9A and 9B could comprise more than two transmission shafts, these would not be necessarily aligned to each other. The transmission shafts 420.1 on the one hand and 420.2 on the other hand could advantageously be connected to each other by transverse arms 436, 438 respectively as is represented in FIG. 11.

The transmission device according to the invention is thus particularly adapted to the manufacture of a microphone. As is represented in FIGS. 1 to 4, a membrane, in contact with the external environment, senses the variations in acoustic pressure and the, advantageously capacitive, detection means, and disposed in a controlled atmosphere advantageously in vacuum, measure these pressure variations which will then be processed. Noises and dampenings intrinsic to air movements between the electrodes are thereby reduced. Alternatively, the detection means could be made by resonating beams, of the guitar string type, advantageously disposed in vacuum.

The capacitive measurement means measure the piston movement within the scope of an open loop microphone. They can also enable a force to be exerted to the transmission element by generating an electrostatic force between the electrodes. This force can enable the behaviour of a spring with a negative stiffness to be adapted. This behaviour enables the resonance frequency of the microphone in use to be adjusted. Thus, in case of a strong signal, the microphone could have a stronger stiffness (less negative stiffness) in order not to saturate, and reversely in case of a low input signal.

This electrostatic force can also be used to control the structure thanks to a feedback loop. The microphone, thus placed within a closed loop, could have a very strong band pass and an improved dynamic range within the scope of a high-performance microphone.

The device according to the invention can also be implemented in a loudspeaker. The transmission element connects the piston which is placed between the external environment and a closed volume at a reference pressure, and a movable electrode of a capacitive actuator. Its arrangement in vacuum would ensure an actuation without an acoustic noise. The piston thus imposes an overpressure/underpressure. The device according to the invention can also be used to provide the "C-MUT (capacitive micro-usined transducer)" function, used in particular for ultrasonographies which ensures transmission and then reception of ultrasounds. By virtue of the invention, the effect of the atmospheric pressure is reduced by virtue of the pivot hinge of the transmission element. On the contrary, in C-MUTs of the state of the art, a membrane separates air from vacuum, the membrane being moved by a counter-electrode. The air gap should thereby take account of the dramatic amplitude of the atmospheric pressure which deforms more or less the membrane. Consequently, a high voltage biases the membrane to attract it and place it at the same air gap whatever the external pressure. The present invention enables the application of these very high voltages to be dispensed with.

The device according to the invention can also be implemented in a sensor used in an aggressive medium, for example an oxidative liquid or causing short-circuits, in these cases the implementation of capacitive means is excluded. By virtue of the present invention, the detection means being disposed in the measurement chamber, they are protected, for example they are protected from water vapour. The device according to the invention can thereby for example be implemented in a flow rate meter function (water meter, clogging of particle filters).

It will be understood that any measurement means can be implemented in the sealed chamber such as resistive or piezoelectric means in the form of a strain gauge.

Further, it could be contemplated that the plate only comprises the aperture 18 to enable the transmission element to sealingly pass between both sealingly insulated zones.

An example of a method for making a device of FIGS. 1 to 6 will now be described in connection with FIGS. 10A to 10J.

A first sacrificial layer 502, for example of SiO$_2$, is made on a substrate 500, for example a standard silicon substrate of 750 μm of thickness. The first sacrificial layer has for example a thickness between a few hundred nanometres and a few micrometres. A layer of a few hundred nanometres to a few μm of polycrystalline silicon 504 is then formed, for example by chemical vapour deposition (CVD), on the first layer 502. The layer 504 will be used to make the sealed insulation element 16.

Alternatively, a silicon on insulator (SOI) substrate could be used directly, the single crystal silicon layer being used for making the sealed insulation element 16.

Then, a second sacrificial layer 506 is made on the layer 504. The second sacrificial layer is for example made in the same material as the first sacrificial layer 502.

The element thus formed is represented in FIG. 10A.

During a following step, the second sacrificial layer is structured, for example by photo-lithography, for example by dry etching, by Reactive Ion Etching (RIE). This structuring has the purpose of leaving only zones corresponding to the moving parts, the sealed insulation element and the transmission element.

The element thus formed is represented in FIG. 10B.

During a following step, the layers 502 and 504 are structured to reach the substrate 500 at the location of the transmission arm. This structuring is made for example by photo-lithography, for example dry etching or RIE.

The element thus formed is represented in FIG. 10C.

During a next step, a silicon layer 508 is made for example by epitaxy, with a few microns to a few tens of microns on the structured layers 502, 504, 506. A mechanical-chemical polishing step can occur to reduce the surface topology. The layer 508 is to make the MEMS.

The element thus formed is represented in FIG. 10D.

During a following step, the layer 508 is structured, for example by deep etching or Deep Reactive Ion Etching (DRIE). During this etching, one of the transmission arms and the transmission shaft are formed.

The element thus formed is represented in FIG. 10E.

During a following step, a first release is made enabling part of the connection to be disengaged. Advantageously, the element of FIG. 10E is submerged in hydrofluoric acid (HF) in liquid or vapour phase for a controlled time.

The element thus formed is represented in FIG. 10F.

During a following step, a cap 510 is bonded to the element of FIG. 10F. This cap comprises a cavity 512 that is to delimit the measurement chamber.

The volume of the cavity 512 is such that it allows a clearance of the second transmission arm. Further, it is chosen sufficiently high, indeed the higher the volume, the better the vacuum. The cap is for example made by machining a standard silicon substrate. The cap is bonded to the element of FIG. 10F, for example by direct bonding (Si—Si/SiO$_2$—SiO$_2$/Si—SiO$_2$), or eutectic sealing (Au—Si, Al—Ge).

Figure 10G:
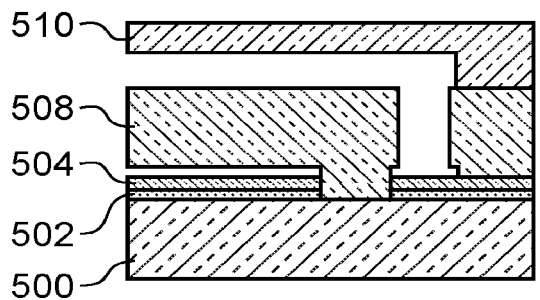
Figure 10G:
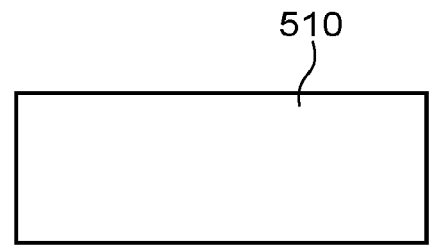

The element thus formed is represented in FIG. 10G.

The element of FIG. 10G is then turned over.

During a following step, the substrate 500 is thinned, for example by DRIE etching and/or grinding and/or mechanical-chemical polishing. The thickness of the second layer used for making the second arm is then achieved, typically a few microns to a few tens of microns.

Figure 10H:
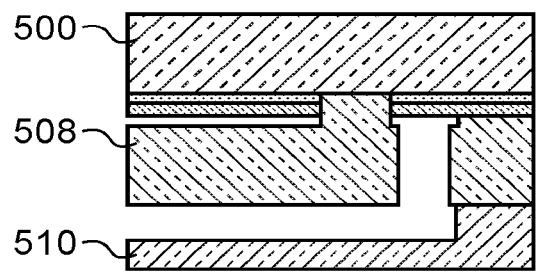
Figure 10H:
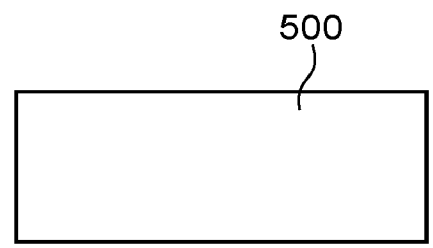

The element thus formed is represented in FIG. 10H.

During a following step, the thinned substrate 500 is structured, for example by etching, for example by DRIE etching, to form the other transmission arm.

Figure 10I:
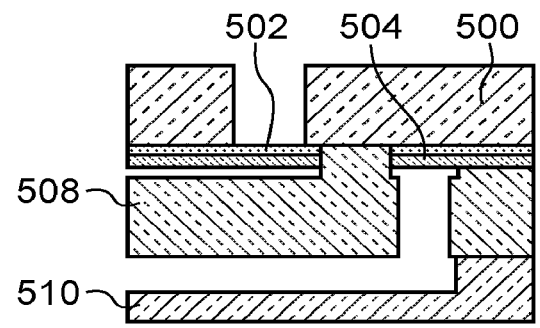
Figure 10I:
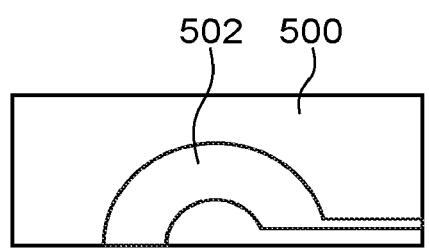
Figure 10J:
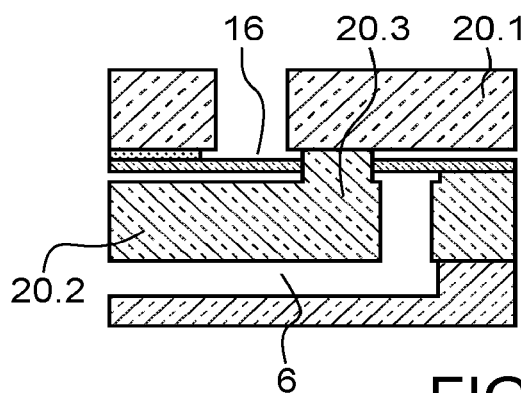
Figure 10J:
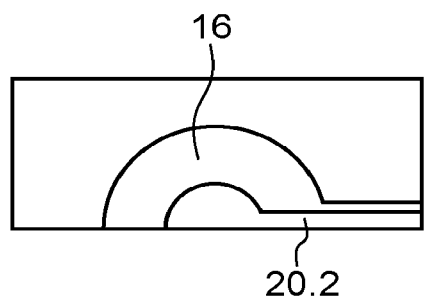

The element thus formed is represented in FIG. 10I.

During a next step, the transmission device is released, for example by submerging in hydrofluoric acid (HF) in liquid or vapour phase for a controlled time.

This manufacturing method is compatible with the manufacture of MEMS/NEMS devices.

As has been described above, the piston 4 and/or the movable electrode can be simultaneously made.

The invention claimed is:

1. A transmission device for a microelectromechanical system, said transmission device being able to transmit a movement and a force between a first zone and a second zone sealingly insulated from each other, said transmission device comprising:
   a support extending in a plane;
   a transmission element rotatably movable with respect to the support by a pivot hinge with an axis of rotation parallel to the support plane, said transmission element comprising at least one first transmission arm on one side of the support plane in one of the first and second zones and a second transmission arm on the other side of the support plane in the other of said first and second zones;
   an aperture in the support through which the transmission element passes and at which the pivot hinge is disposed; and
   a sealed insulation device disposed in the aperture, such that the sealed insulation device sealingly insulates the first zone from the second zone and they allow the rotational movement of the transmission element.

2. The transmission device according to claim 1, wherein the sealed insulation device comprises an elastically deformable membrane which is tensioned between a rim of the aperture and the transmission element.

3. The transmission device according to claim 2, wherein the sealed insulation device comprises mechanical reinforcements on at least one of the faces of the membrane.

4. The transmission device according to claim 1, wherein the pivot hinge comprises one blade or several aligned blades extending between the transmission element and an edge of the aperture and able to be torsionally deformed.

5. The transmission device according to claim 4, wherein the blade(s) has (have) a dimension along a direction orthogonal to the support plane such that the blade(s) offer(s) a rigidity in the off-plane direction limiting off-plane movements of the transmission element.

6. The transmission device according to claim 1, wherein the transmission element comprises at least one transmission shaft connecting the first and second transmission arms, said transmission shaft extending in a direction orthogonal to the support plane on either side of the sealed insulation device.

7. The transmission device according to claim 6, wherein the pivot hinge comprises one blade or several aligned blades extending between the transmission element and an edge of the aperture and able to be torsionally deformed, and wherein the blade(s) is (are) connected to the transmission shaft and the assembly formed by the transmission shaft and the first and second transmission arms is a rigid assembly.

8. The transmission device according to claim 6, wherein the transmission element comprises several transmission shafts configured to be translationally moved along a direction orthogonal to the support plane.

9. The transmission device according to claim 8, wherein each of the first and second transmission arms is hinged to each transmission shaft by a hinge allowing a rotation and a translation and in which the blade(s) is (are) mechanically connected to one of the first and second transmission arms.

10. The transmission device according to claim 9, wherein for each transmission shaft, the hinge allowing a rotation and a translation of said transmission shaft comprises one or more coupling blades.

11. The transmission device according to claim 1, wherein at least one of the first and second zones form a controlled atmosphere chamber.

12. The transmission device according to claim 1, comprising an element movable relative to the support such as a piston or a membrane able to apply a movement and a force to the transmission element in the first zone.

13. The transmission device according to claim 1, comprising, in the second zone, a sensor for measuring the movement of and/or the force applied to the transmission element in the first zone and/or an actuator.

14. The transmission device according to claim 13, comprising, in the second zone, at least one electrode secured to the transmission element and at least one counter-electrode forming the sensor for measuring the movement of and/or the force applied to the transmission element in the first zone and/or an actuator.

15. A system comprising:
at least one of the transmission device according to claim 12 forming a differential pressure sensor.

16. A system comprising:
at least one of the transmission device according to claim 13 forming a differential pressure sensor.

17. The system according to claim 15, further comprising an element movable relative to the support such as a piston or a membrane able to apply a movement and a force to the transmission element in the first zone, said system forming a microphone, wherein the piston or the membrane comprises a face subjected to an environment the pressure variations of which are desired to be detected and a face subjected to a reference pressure.

18. The system according to claim 16, further comprising an element movable relative to the support such as a piston or a membrane able to apply a movement and a force to the transmission element in the first zone, said system forming a microphone, wherein the piston or the membrane comprises a face subjected to an environment the pressure variations of which are desired to be detected and a face subjected to a reference pressure.

19. A system comprising:
the transmission device according to claim 13;
an element movable relative to the support, the element including a piston or a membrane able to apply a movement and a force to the transmission element in the first zone, said system forming a loudspeaker,
wherein the piston or membrane is to be moved to emit a sound.

20. A method for manufacturing the transmission device according to claim 1, comprising, from a stack comprising a substrate, a first sacrificial layer, a sandwich layer for forming the sealed insulation means, a second sacrificial layer:
a) structuring the layers so as to have access to the substrate,
b) forming a thick layer on the second sacrificial layer and in contact with the substrate,
c) forming one of the transmission arms,
d) at least partially removing the second sacrificial layer,
e) bonding a cap on the thick layer,
f) turning over the assembly,
g) forming the other transmission arm, and
h) at least partially removing the first sacrificial layer so as to release the sandwich layer.

21. The method according to claim 20, the transmission element further comprising at least one transmission shaft formed at least partly during step c) and at least partly during step g).

22. The method according to claim 20, wherein step c) is achieved by structuring the thick layer and step g) is achieved by structuring the substrate.

* * * * *